(12) United States Patent
Lee et al.

(10) Patent No.: US 10,381,474 B2
(45) Date of Patent: Aug. 13, 2019

(54) POWER SEMICONDUCTOR DEVICE

(71) Applicant: MACROBLOCK, INC., Hsinchu (TW)

(72) Inventors: Kung-Yen Lee, Hsinchu (TW);
Chih-Fang Huang, Hsinchu (TW);
Sheng-Chung Wang, Hsinchu (TW);
Chia-Hui Cheng, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 0 days.

(21) Appl. No.: 15/955,444

(22) Filed: Apr. 17, 2018

(65) Prior Publication Data

US 2018/0308974 A1    Oct. 25, 2018

(30) Foreign Application Priority Data

Apr. 20, 2017   (TW) .............................. 106113215 A

(51) Int. Cl.
| | | |
|---|---|---|
| H01L 29/76 | (2006.01) | |
| H01L 29/78 | (2006.01) | |
| H01L 29/06 | (2006.01) | |
| H01L 29/66 | (2006.01) | |

(52) U.S. Cl.
CPC ...... *H01L 29/7811* (2013.01); *H01L 29/0623* (2013.01); *H01L 29/0634* (2013.01); *H01L 29/66712* (2013.01)

(58) Field of Classification Search
CPC ............. H01L 29/0634; H01L 29/0623; H01L 29/66712
See application file for complete search history.

(56) References Cited

U.S. PATENT DOCUMENTS

| | | | |
|---|---|---|---|
| 7,902,604 B2* | 3/2011 | Su | H01L 27/0255 257/356 |
| 2007/0138543 A1 | 6/2007 | Saito | |
| 2008/0237701 A1 | 10/2008 | Willmeroth et al. | |

FOREIGN PATENT DOCUMENTS

| | | |
|---|---|---|
| CN | 1445860 A | 10/2003 |
| CN | 101964343 A | 2/2011 |
| JP | 2001-313393 A | 11/2001 |

OTHER PUBLICATIONS

Taiwanese Search Report dated Jan. 15, 2019 by the TIPO regarding Taiwanese Application No. 106113215, Filed Apr. 20, 2017, 2 pages.

* cited by examiner

*Primary Examiner* — Samuel A Gebremariam
(74) *Attorney, Agent, or Firm* — Christensen O'Connor Johnson Kindness PLLC

(57) ABSTRACT

A power semiconductor device includes a substrate, a main body and an electrode unit. The main body includes an active portion, an edge termination portion surrounding the active portion, and an insulating layer disposed on the edge termination portion. The edge termination portion includes a first-type semiconductor region, and a plurality of spaced-apart second-type semiconductor segments distributed in the first-type semiconductor region and arranged at intervals along a Y-direction directing from the insulating layer toward the substrate, and an X-direction directing from the active portion toward the edge termination portion. The electrode unit includes a first electrode and a second electrode.

16 Claims, 18 Drawing Sheets

POWER SEMICONDUCTOR DEVICE

CROSS-REFERENCE TO RELATED APPLICATION

This application claims priority of Taiwanese Invention Patent Application No. 106113215, filed on Apr. 20, 2017.

FIELD

The disclosure relates to a power semiconductor device, and more particularly to a power semiconductor device including an edge termination portion having a first-type semiconductor region and a plurality of spaced-apart second-type semiconductor segments distributed in the first-type semiconductor region.

BACKGROUND

A conventional power semiconductor device generally includes an active portion including a plurality of transistors that are electrically connected in parallel and an edge termination portion surrounding the active portion. The edge termination portion contributes to the removal of undesired leakage current or accumulated electrostatic charges in the active portion.

The transistors of the active portion are formed with a plurality of alternately arranged n-type and p-type semiconductor pillars. The edge termination portion typically includes an n-type semiconductor layer and a p-type semiconductor layer to form a junction. When a depletion area of the junction is increased by decreasing an n-type doping concentration of the n-type semiconductor layer and a p-type doping concentration of the p-type semiconductor layer, an accordingly decreased electric field intensity of the junction will lead to uneven electric field lines, and thus the power semiconductor device has a relatively low breakdown voltage. When the electric field intensity of the junction is increased by increasing the n-type doping concentration of the n-type semiconductor layer and the p-type doping concentration of the p-type semiconductor layer, the breakdown voltage of the power semiconductor device will still be low because of the decreased depletion area of the junction.

Besides, for forming the plurality of alternately arranged n-type and p-type semiconductor pillars of the active portion, a thermal budget of a thermal process for forming the p-type semiconductor pillars that can be connected among the n-type semiconductor pillars of the conventional power semiconductor device, is relatively large.

SUMMARY

Therefore, an object of the disclosure is to provide a power semiconductor device that can alleviate at least one of the drawbacks of the prior art.

According to the disclosure, a power semiconductor device includes a substrate, a main body and an electrode unit. The substrate has a top side.

The main body includes an active portion disposed on the substrate, an edge termination portion disposed on the top side of the substrate and surrounding the active portion, and an insulating layer disposed on the edge termination portion and spaced apart from the substrate. The edge termination portion includes an edge termination top surface underlying the insulating layer, a first-type semiconductor region that extends from the top side of the substrate to the edge termination top surface, and a plurality of spaced-apart second-type semiconductor segments distributed in the first-type semiconductor region. The spaced-apart second-type semiconductor segments are arranged at intervals along a Y-direction that directs from the insulating layer toward the substrate. The spaced-apart second-type semiconductor segments are arranged to have at least one interval along an X-direction that is perpendicular to the Y-direction, and that directs from the active portion toward the edge termination portion.

The electrode unit includes a first electrode that is disposed on the insulating layer and that is electrically coupled to the active region, and a second electrode that is disposed on the substrate and that is spaced apart from the main body.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
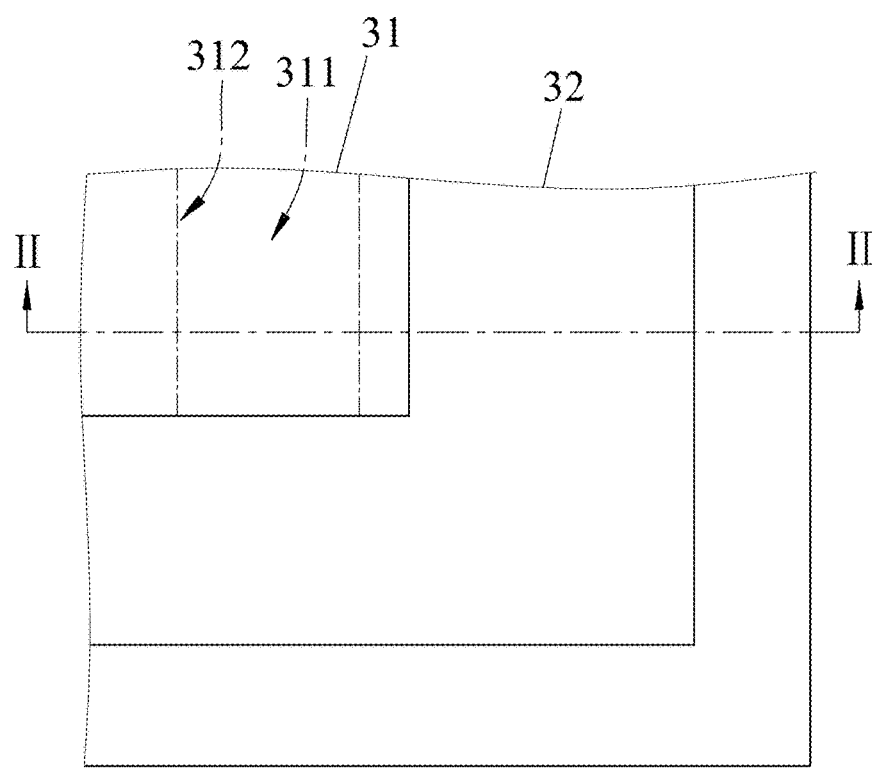
FIG. 1 is a fragmentary top view of an embodiment of a power semiconductor device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
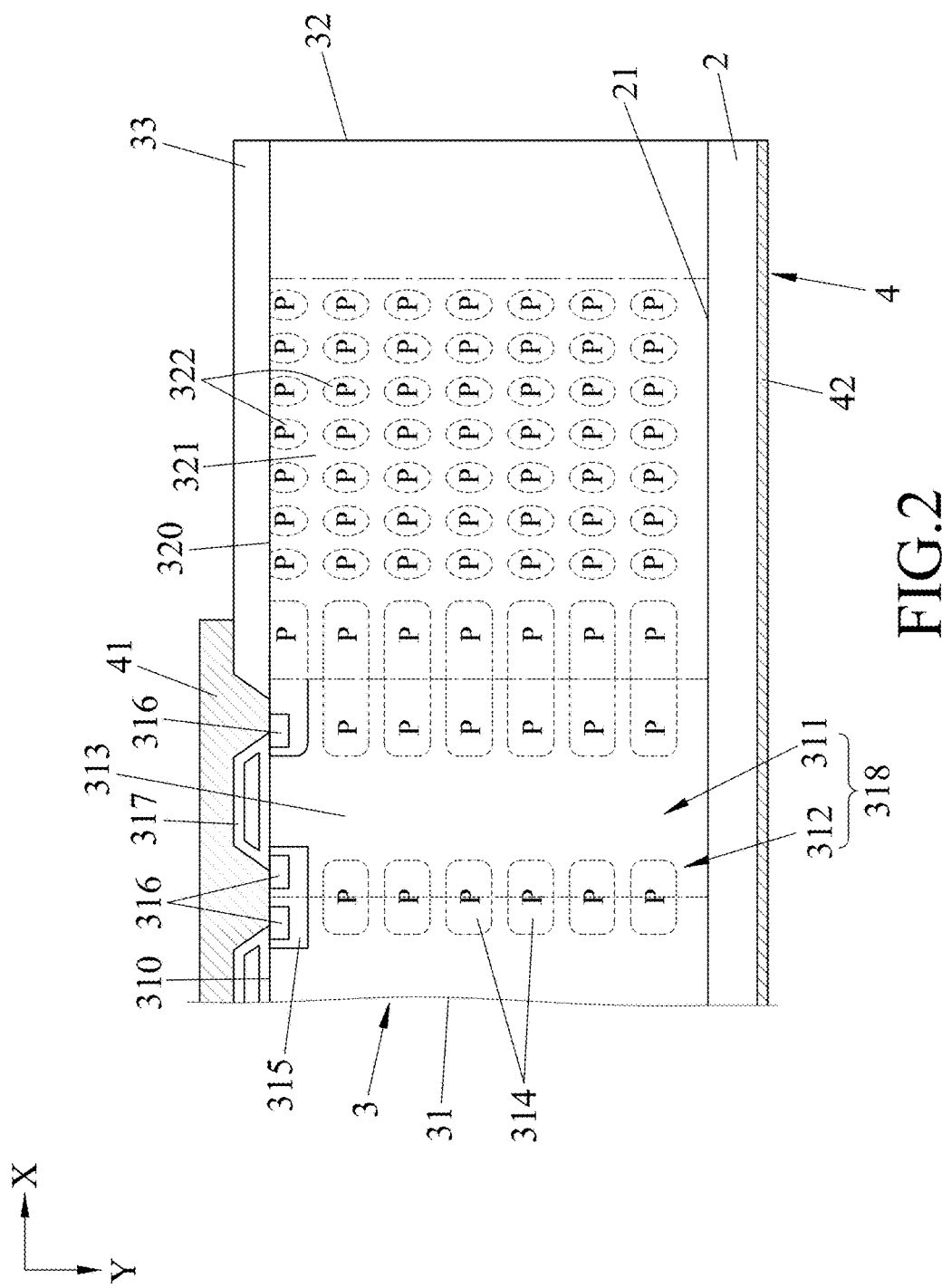
FIG. 2 is a schematic cross-sectional view taken along line II-II of FIG. 1.

Referring to FIGS. 1 and 2, a first embodiment of a power semiconductor device according to the disclosure includes a substrate 2, a main body 3 and an electrode unit 4. The substrate 2 has a top side 21.

The main body 3 includes an active portion 31 disposed on the substrate 2, an edge termination portion 32 disposed on the top side 21 of the substrate and surrounding the active portion 31, and an insulating layer 33 disposed on the edge termination portion 32 and spaced apart from the substrate 2.

The edge termination portion 32 includes an edge termination top surface 320 underlying the insulating layer 33, a first-type semiconductor region 321 that extends from the top side 21 of the substrate 2 to the edge termination top surface 320, and a plurality of spaced-apart second-type semiconductor segments 322 that are distributed in the first-type semiconductor region 321. The spaced-apart second-type semiconductor segments 322 are arranged at intervals along a Y-direction that directs from the insulating layer 33 toward the substrate 2. In addition, the spaced-apart second-type semiconductor segments 322 are arranged to have at least one interval along an X-direction that is perpendicular to the Y-direction and that directs from the active portion 31 toward the edge termination portion 32.

The active portion 31 of the main body 3 has a top surface 310 opposite to the substrate 2, and includes a plurality of first semiconductor pillar regions 311, a plurality of second semiconductor pillar regions 312, a plurality of well regions 315, a plurality of sources regions 316, and a plurality of gate regions 317. To be specific, the first semiconductor pillar regions 311 and the second semiconductor pillar regions 312 alternate along the X-direction, such that top surfaces of the first semiconductor pillar regions 311 and top surfaces of the second semiconductor pillar regions 312 cooperatively define the top surface 310 of the active portion 31. Each of the second semiconductor pillar portions 312 is trapezoidal in cross-sectional shape. Each of the first semiconductor pillar regions 311 includes a first-type semiconductor section 313. Each of the second semiconductor pillar regions 312 has a plurality of spaced-apart second-type semiconductor segments 314 that are aligned along the Y-direction.

Each of the well regions 315 is formed on a respective one of the second semiconductor pillar regions 312 and is indented from the top surface 310 of the active portion 31 toward the substrate 2. Each two adjacent ones of the source regions 316 are formed in a corresponding one of the well regions 315 in a spaced apart manner and are indented from the top surface 310 of the active portion 31. Each of the gate regions 317 is disposed on the top surface of a respective one of the first semiconductor pillar regions 312 and is connected to two adjacent ones of the source regions 316. Therefore, a plurality of transistors 318, each having a super junction interface are formed, and the transistors 318 are electrically connected in parallel. It is worth noting that the transistors 318 may be super junction transistors or normal transistors. The configuration of each of the transistors 318 is not of the essence of the present disclosure, and is well known to those skilled in the art. Thus, further details thereof are not provided herein for the sake of brevity.

The electrode unit 4 includes a first electrode 41 and a second electrode 42. The first electrode 41 is disposed on the insulating layer 33 and is electrically coupled to the active region 31. The second electrode 42 is disposed on the substrate 2 and is spaced apart from the main body 3.

Doped materials used in the first and second semiconductor pillar regions 311, 312, the first-type semiconductor region 321 and the second-type semiconductor segments 322 should not be limited in the disclosure. In this embodiment, the doped materials of the first semiconductor pillar region 311 and the first-type semiconductor region 321 are n-type semiconductors, which include ions of group V elements as majority carriers, and the doped semiconductor materials of the second semiconductor pillar region 312 and the second-type semiconductor segments 322 are p-type semiconductors, which include ions of group III elements as majority carriers.

More specifically, each of the second-type semiconductor segments 314 of one of the second semiconductor pillar regions 312, which is most adjacent to the edge termination portion 32, is connected to a respective one of the second-type semiconductor segments 322 of the edge termination portion 32, which is most adjacent to the one of the second semiconductor pillar regions 312. Hence, an electric field distribution can extend continuously from the active portion 31 to the edge termination portion 32, and undesired leakage current or accumulated electrostatic charges in the active portion 31 are easily removed, so that the power semiconductor device of the disclosure can be miniaturized. In one form, the second-type semiconductor segments 314 of one of the second semiconductor pillar regions 312, which is most adjacent to the edge-termination portion 32, may be respectively disconnected from the second-type semiconductor segments 322 of the edge termination portion 32, which are most adjacent to the one of the second semiconductor pillar regions 312.

In addition, the second-type semiconductor segments 314 of each of the second semiconductor pillar regions 312 have varying second-type doping concentrations that vary along the Y-direction. A second-type doping concentration difference between every two adjacent ones of the second-type semiconductor segments 314 of each of the second semiconductor pillar regions 312 is less than 10%. For example, the second-type doping concentrations of each of the second semiconductor pillar regions 312 may be increased or decreased along the Y-direction. In another form, the second-type doping concentrations of each of the second semiconductor pillar regions 312 may be decreased along the Y-direction.

The second-type semiconductor segments 322 of the edge termination portion 32 have varying second-type doping concentrations that vary along the Y-direction, and a second-type doping concentration difference between two adjacent ones of the second-type semiconductor segments 322 along the Y-direction is less than 10%. Furthermore, the varying second-type doping concentrations of the second-type semiconductor segments 322 of the edge termination portion 32 vary along the X-direction, and a second-type doping concentration difference between two adjacent ones of the second-type semiconductor segments 322 along the X-direction is less than 10%.

In the disclosure, the varying second-type doping concentrations of the second-type semiconductor segments 322 that vary along the X-direction are not limited. For example, the second-type doping concentrations may be increased or decreased along the X-direction. Besides, the varying second-type doping concentrations of the second-type semiconductor segments 322 that vary along the Y-direction are not limited. For example, the second-type doping concentrations of the second-type semiconductor segments 322 may be increased or decreased along the Y-direction. In one form, the second-type doping concentrations of the second-type semiconductor segments 314 of each of the second semiconductor pillar regions 312, and the second-type doping concentrations of the second-type semiconductor segments 322 are increased or decreased synchronously along the Y-direction.

Figure 3:
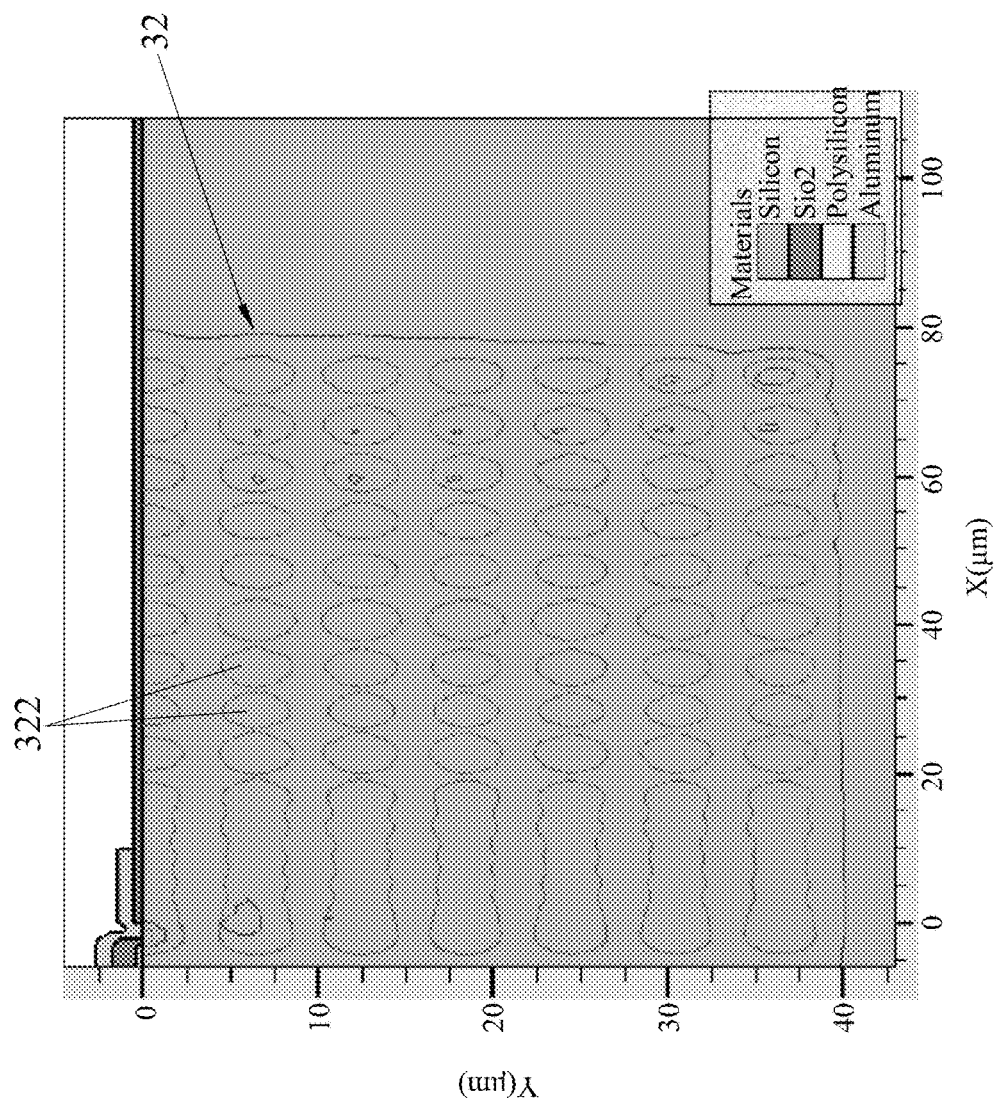
FIG. 3 is a plot illustrating simulation results of an edge termination portion of the first embodiment of FIG. 2.
Figure 4:
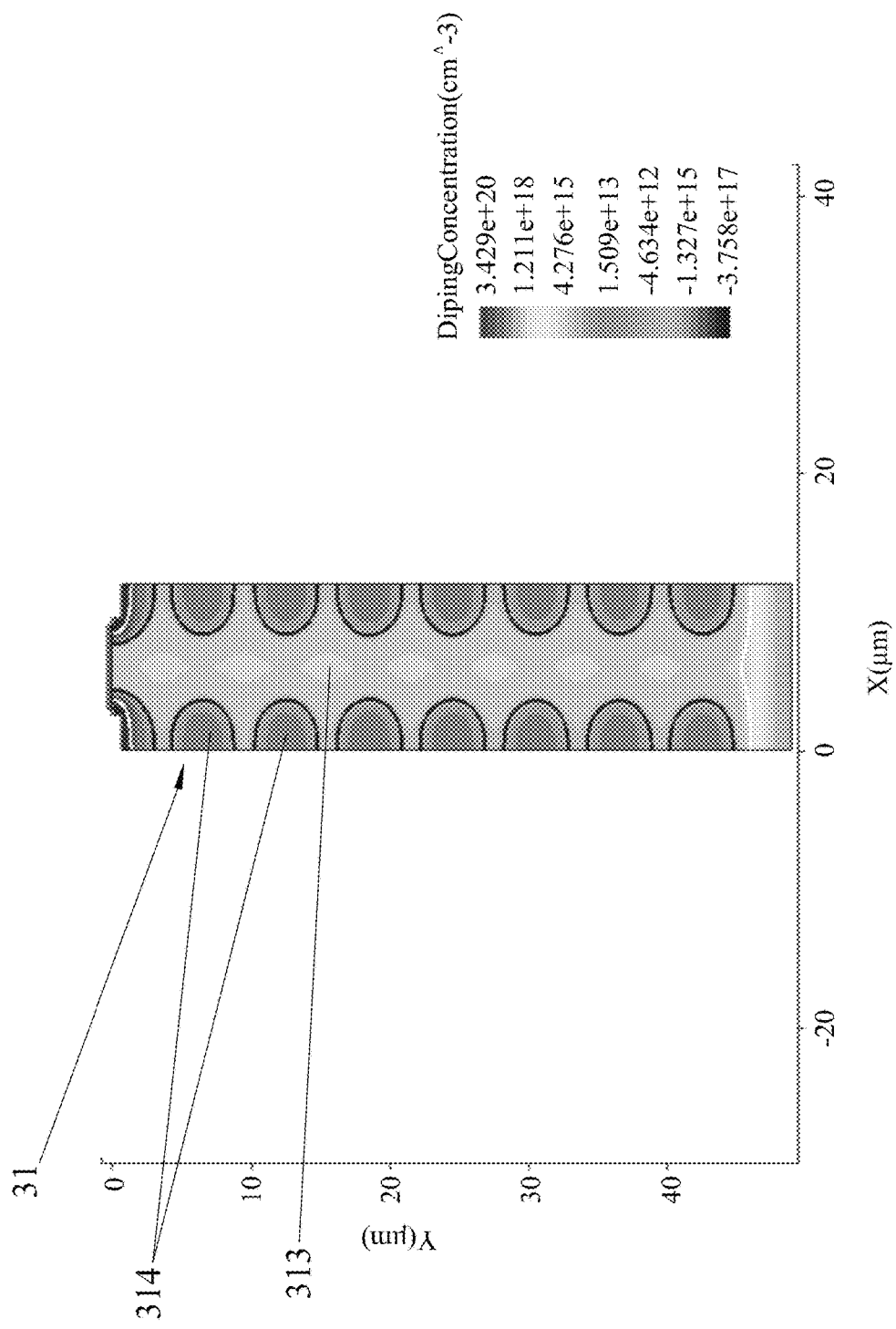
FIG. 4 is plot illustrating simulation results of one of transistors of an active portion of the first embodiment of FIG. 2.

Further referring to FIG. 3, a structure of the edge termination portion 32 of the first embodiment is illustrated using a simulation software "TCAD" (produced by Silvaco Inc.) for manufacturing semiconductor elements. Referring to FIG. 4, a structure of one of the transistors of the active portion 31 is illustrated using the same simulation software. In this embodiment, the power semiconductor device is manufactured using multi-epitaxial techniques. More specifically, when the power semiconductor device is manufactured, an n-type semiconductor layer is first formed on the substrate 2 using an epitaxial process, followed by doping p-type carriers in the n-type semiconductor layer to form a layered portion of the main body 3 including apart the p-type semiconductor segments 322, 314 of the edge termination portion 32 and the active portion 31 in the n-type semiconductor layer. Thereafter, the epitaxial process and the doping process are repeatedly conducted to form a plurality of the n-type semiconductor layers, so that the power semiconductor device of the disclosure with an increased breakdown voltage is formed.

When the second-type semiconductor segments 314 of one of the second semiconductor pillar regions 312 that is most adjacent to the edge termination portion 32 is connected to the respective one of the second-type semiconductor segments 322 of the edge termination portion 32 that is most adjacent to the one of the second semiconductor pillar regions 312, the second-type semiconductor segments 314, 322 in the same n-type semiconductor layer may be formed simultaneously using a single mask. Thus, an additional mask can be omitted so as to reduce the manufacturing cost of the power semiconductor device. Besides, by utilizing multi-epitaxial techniques in manufacturing, a thermal budget of a thermal process for forming the active portion 31 and the edge termination portion 32 can be easily controlled compared to a single epitaxial technique.

With the inclusion of the second-type semiconductor segments 314 of the active portion 31 and the second-type semiconductor segments 322 of the edge termination portion 32, and by connecting a number of the second-type semiconductor segments 314 of the active portion 31 with the corresponding ones of the second-type semiconductor segments 322 of the edge termination portion 32, uniformity of the electric field distribution of the power semiconductor device thus formed can be improved.

Figure 5:
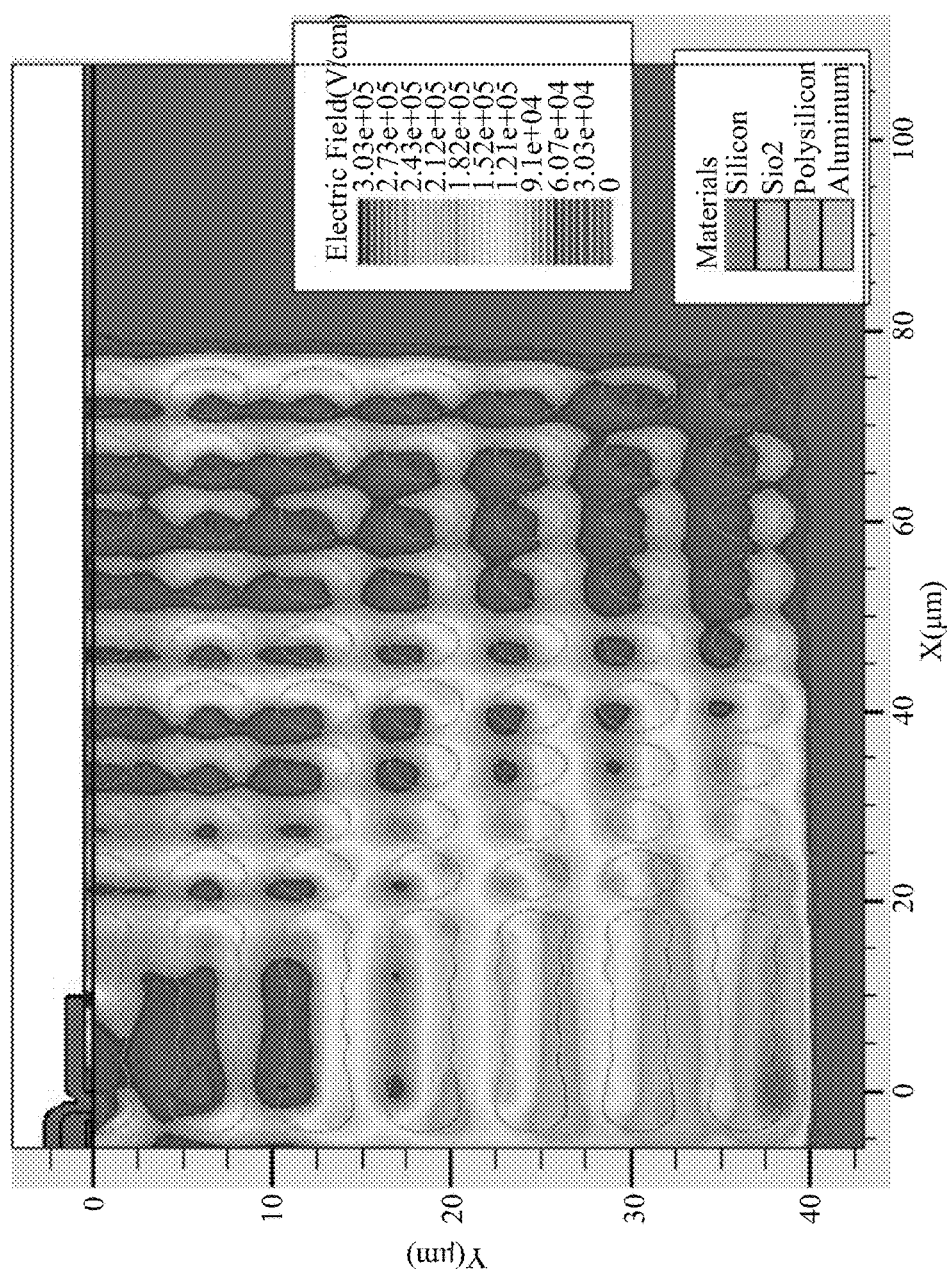
FIG. 5 is a plot illustrating simulation results of breakdown field strength of the edge termination portion of the first embodiment of FIG. 2.
Figure 6:
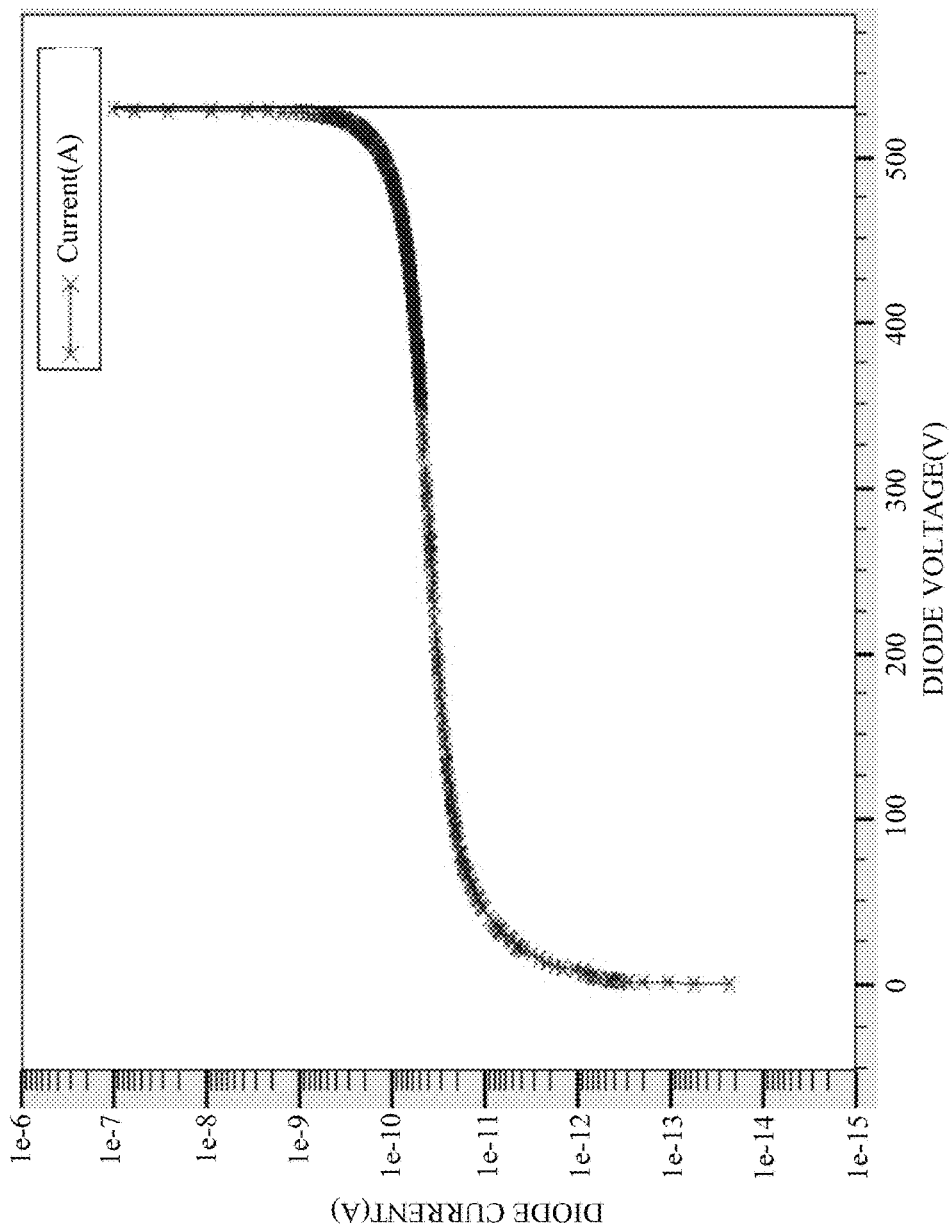
FIG. 6 is a chart illustrating a reverse current-voltage curve of the edge termination portion of the first embodiment.

Referring to FIG. 5, simulation results of breakdown field strength of the edge termination portion 32 of the first embodiment of the power semiconductor device with the abovementioned simulation software is illustrated. Referring to FIG. 6, a chart of a reverse current-voltage curve of the edge termination portion 32 of the first embodiment of the power semiconductor device is illustrated. Referring back to FIGS. 1 and 2, the results shown in FIGS. 5 and 6 prove that by way of the structural design of the second-type semiconductor segments 314 of the active portion 31 and the second-type semiconductor segments 322 of the edge termination portion 32, the electric field distribution at an interface between the active portion 31 and the edge termination portion 32 can continuously and effectively expand outward so that the electric field distribution can extend from the active portion 31 to the edge termination portion 32. The reverse current-voltage curve of FIG. 6 shows that the breakdown voltage of the edge termination portion 32 is around 540 V.

Figure 7:
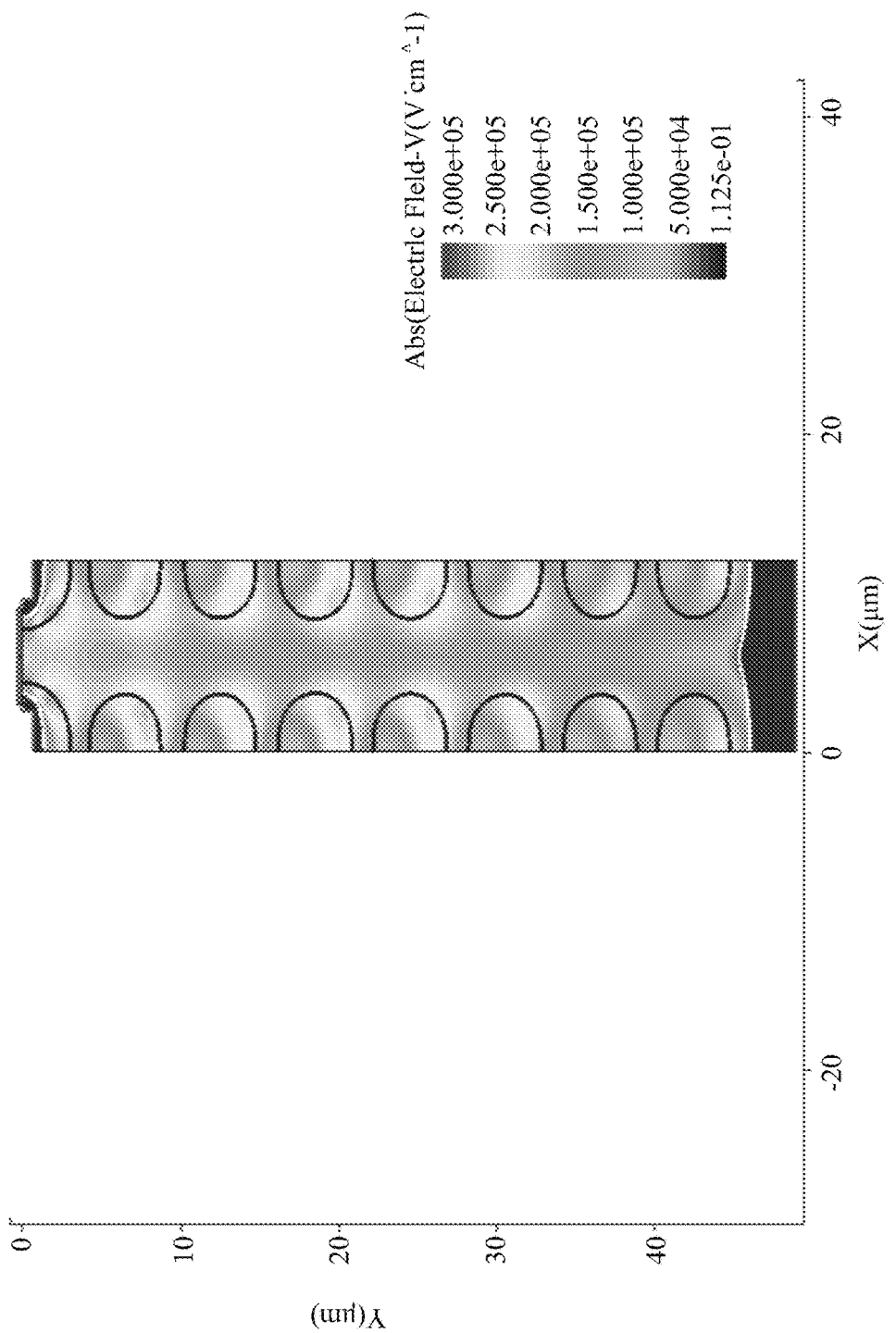
FIG. 7 is a plot illustrating simulation results of breakdown field strength of the one of transistors of the active portion of the first embodiment.
Figure 8:
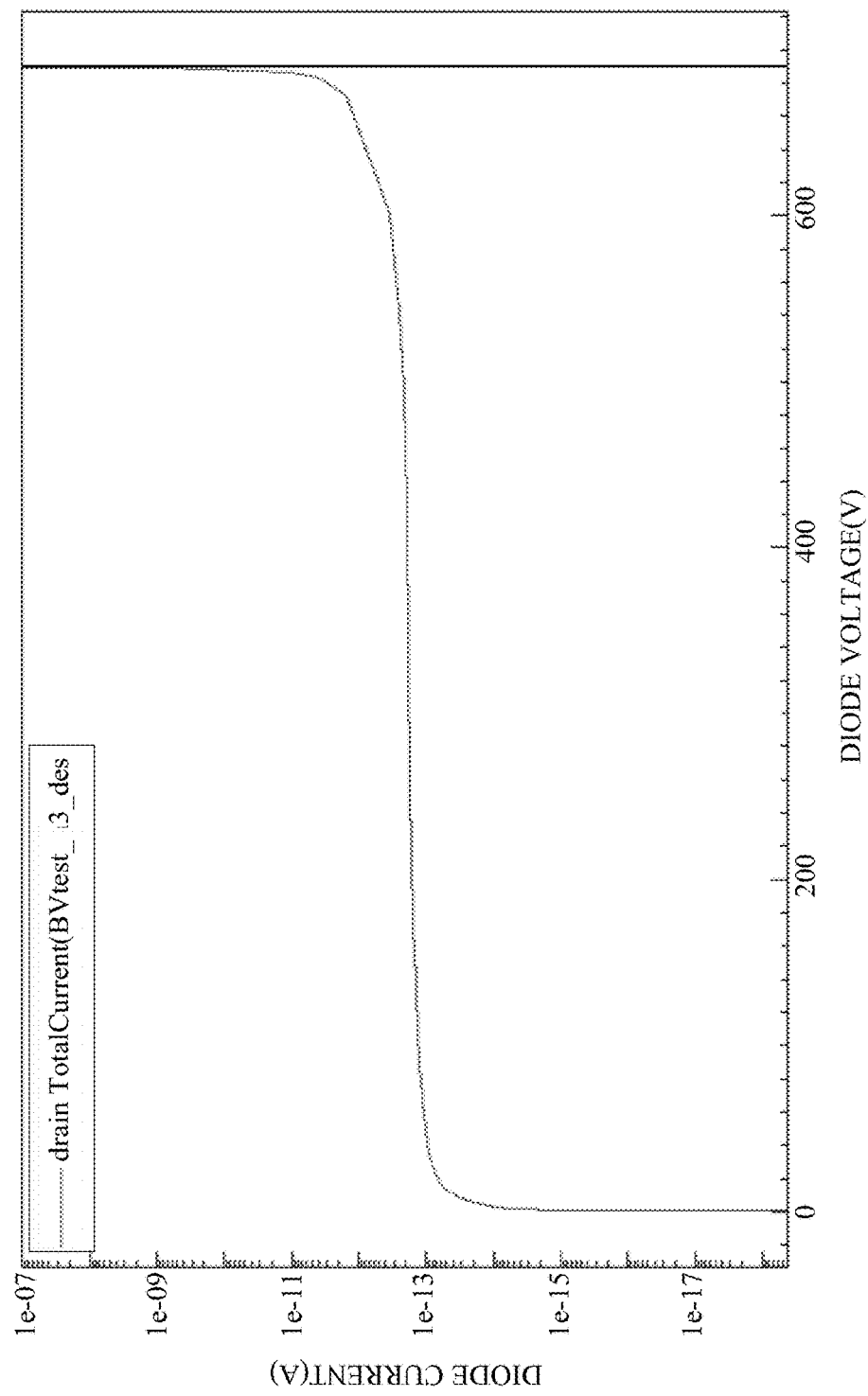
FIG. 8 is a chart of reverse drain current versus drain voltage curve of the active portion of the first embodiment.
Figure 9:
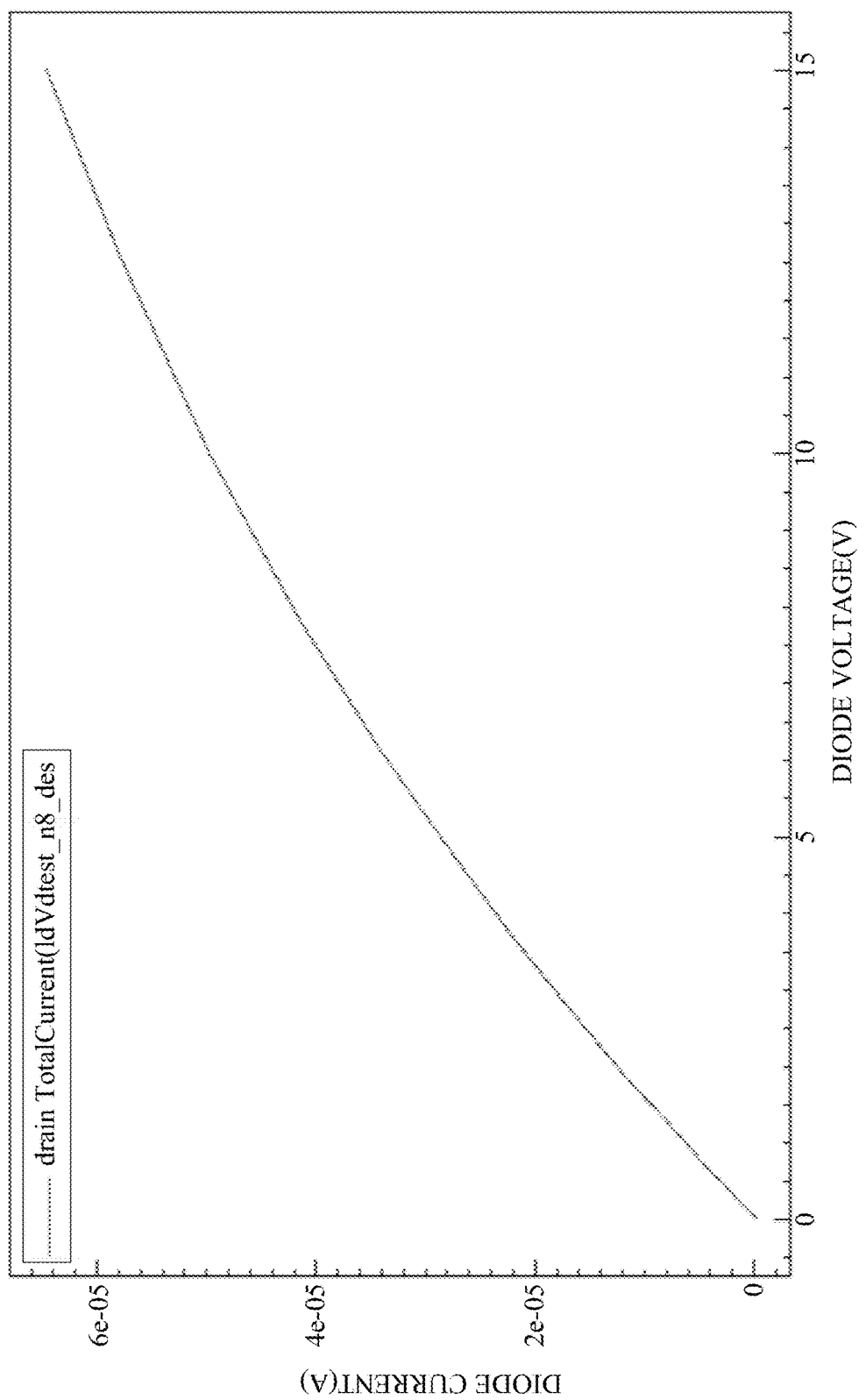
FIG. 9 is a chart of a forward drain current versus drain voltage curve of the active portion of the first embodiment.

Referring to FIGS. 7 to 9, FIG. 7 illustrates a simulation results of breakdown field strength of one of the transistors 318 of the active portion 31 of the first embodiment of the power semiconductor device using the abovementioned software. The result shows that the breakdown field strength can be decreased by the structural design of the spaced-apart second-type semiconductor segments 314 of the active portion 31. FIG. 8 is a chart showing reverse drain current versus drain voltage curve of the active portion 31 of the first embodiment of the power semiconductor device. The result shows that a breakdown voltage of the active portion 31 is around 687 V. FIG. 9 is a chart showing a forward drain current versus drain voltage curve of the active portion 31 of the first embodiment of the power semiconductor device. In addition, the on-state resistance ($R_{DS_{on}}$) of 34.3 mΩ–cm$^2$ is calculated by multiplying a tangent slope of the forward drain current versus drain voltage curve at 10 V of the applied drain voltage by a cross-sectional area of the active portion 31.

Figure 10:
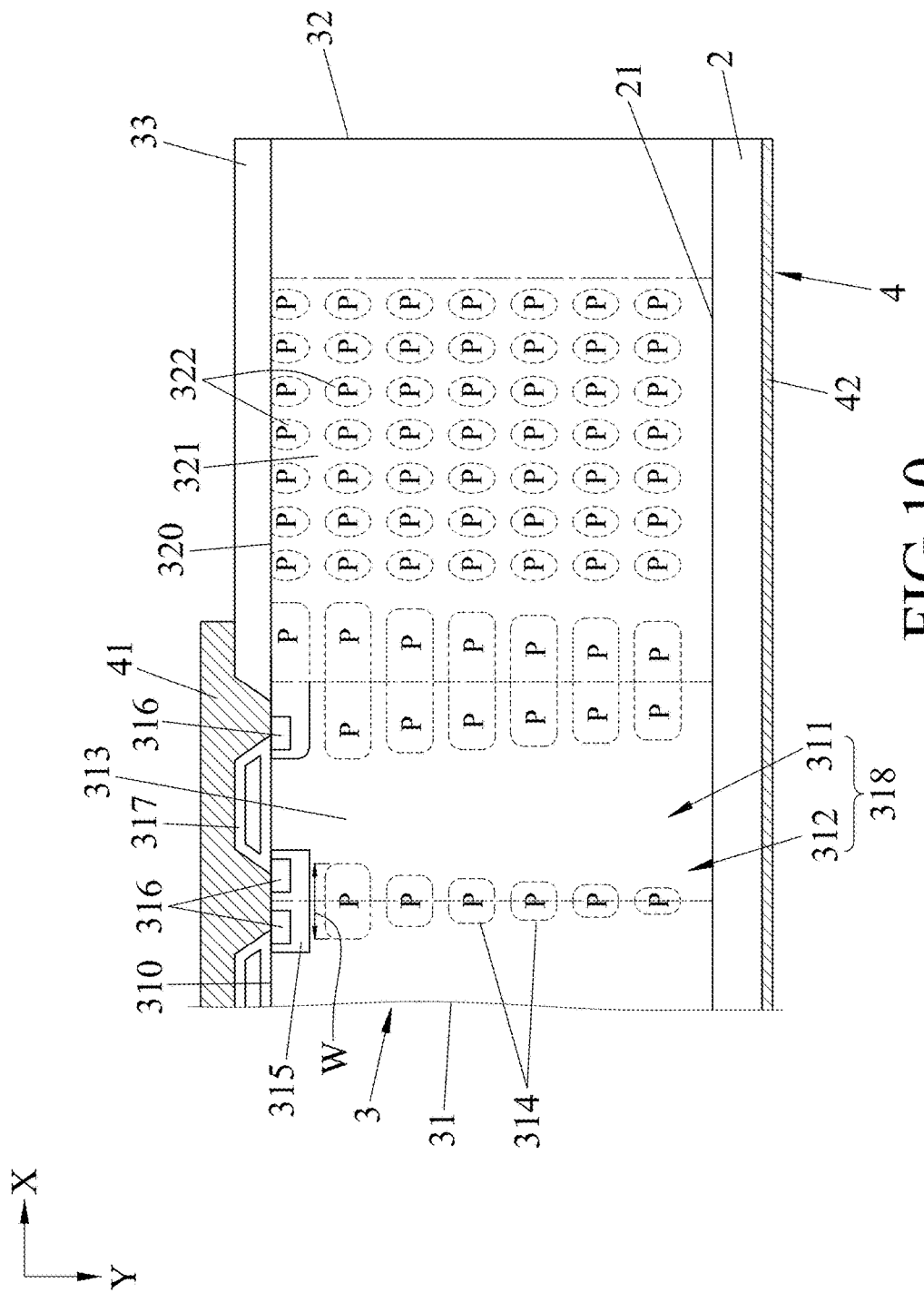
FIG. 10 is a fragmentary schematic cross-sectional view of a second embodiment of the power semiconductor device according to the disclosure.
Figure 11:
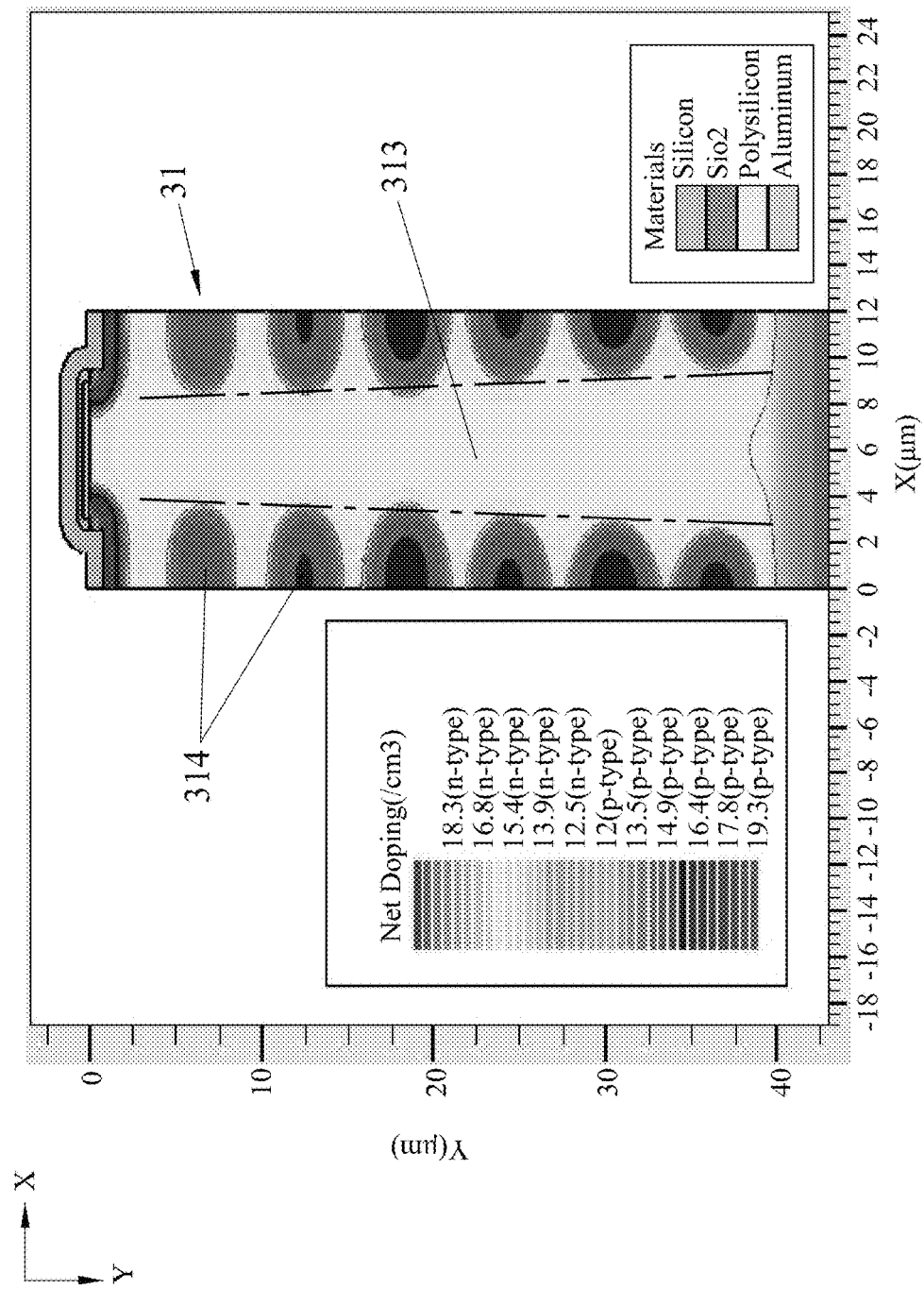
FIG. 11 is a plot illustrating simulation results of one of transistors of an active portion of the second embodiment.

Referring to FIGS. 10 and 11, a second embodiment of the power semiconductor device according to the disclosure, and simulation results of one of the transistors of the active portion 31 of the second embodiment using the same software as that of the first embodiment are respectively illustrated. Each of the second-type semiconductor segments 314 of each of the second semiconductor pillar regions 312 of the active portion 31 has a width (W) extending along the X-direction. The widths (W) of the second-type semiconductor segments 314 of each of the second semiconductor pillar regions 312 decrease along the Y-direction (Y), such that each of the second semiconductor pillar portions 312 is inverted-trapezoidal in cross-sectional shape.

Figure 12:
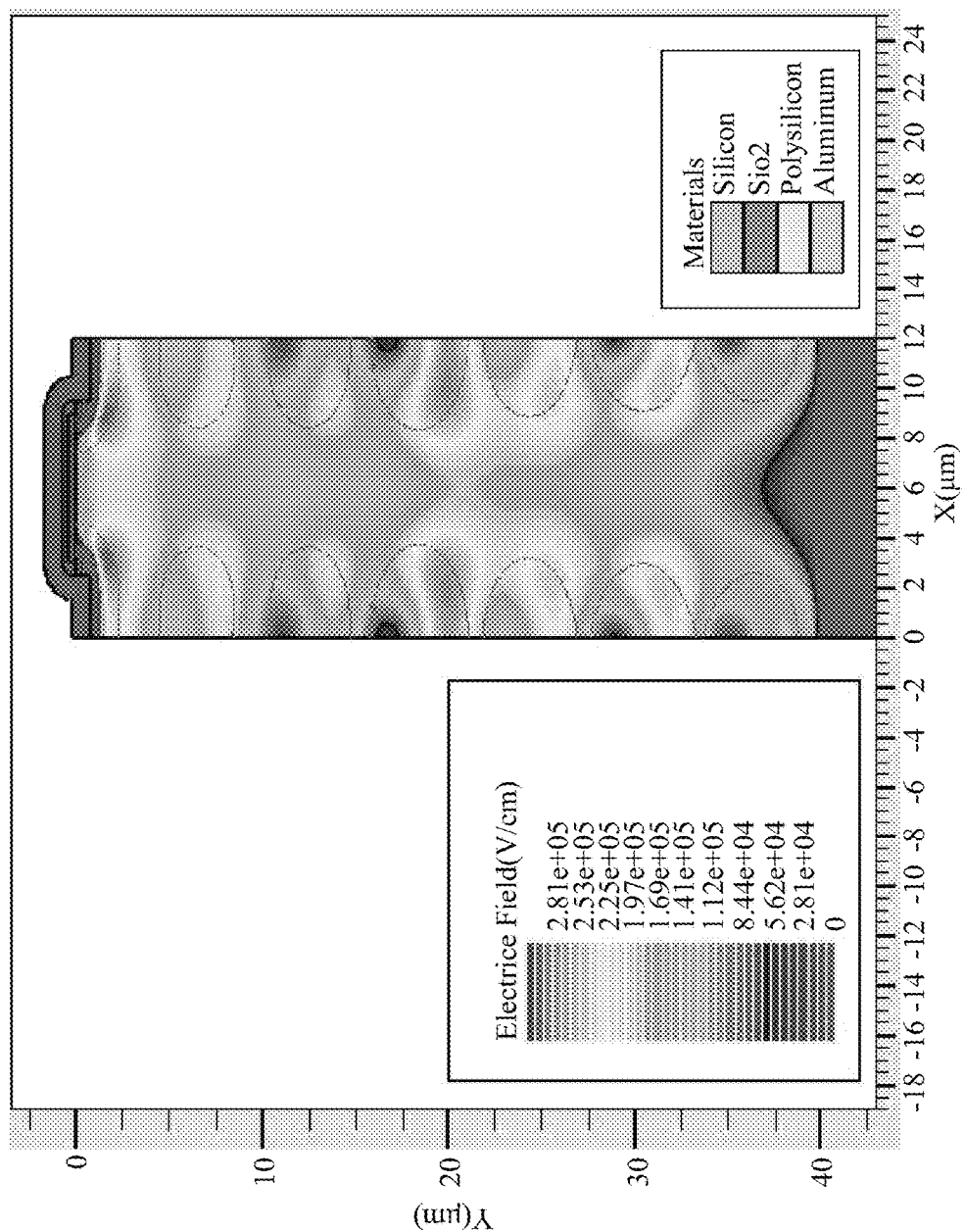
FIG. 12 a plot illustrating simulation results of breakdown field strength of the one of transistors of the active portion of the second embodiment.
Figure 13:
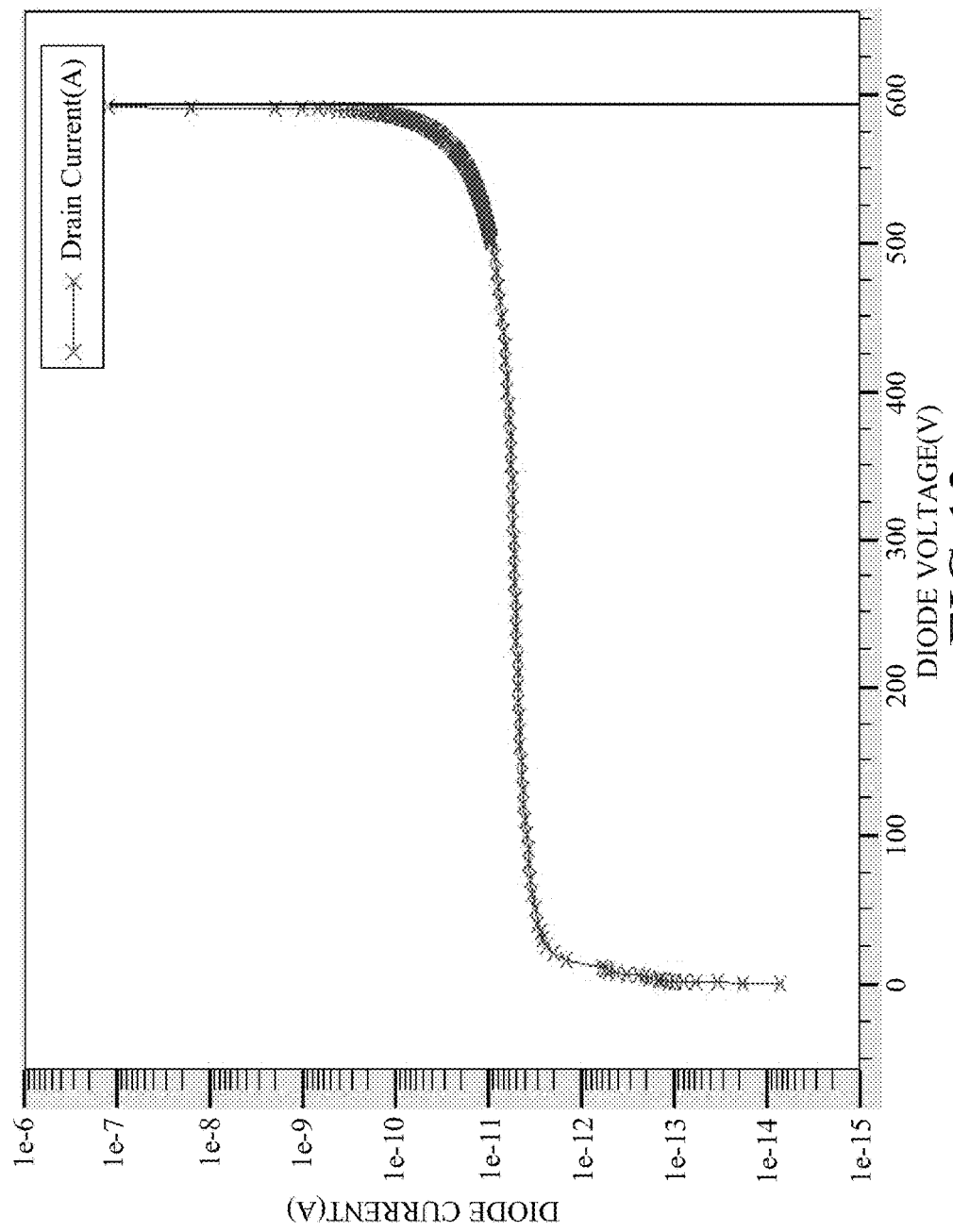
FIG. 13 is a chart of a reverse drain current versus drain voltage curve of the active portion of the second embodiment.
Figure 14:
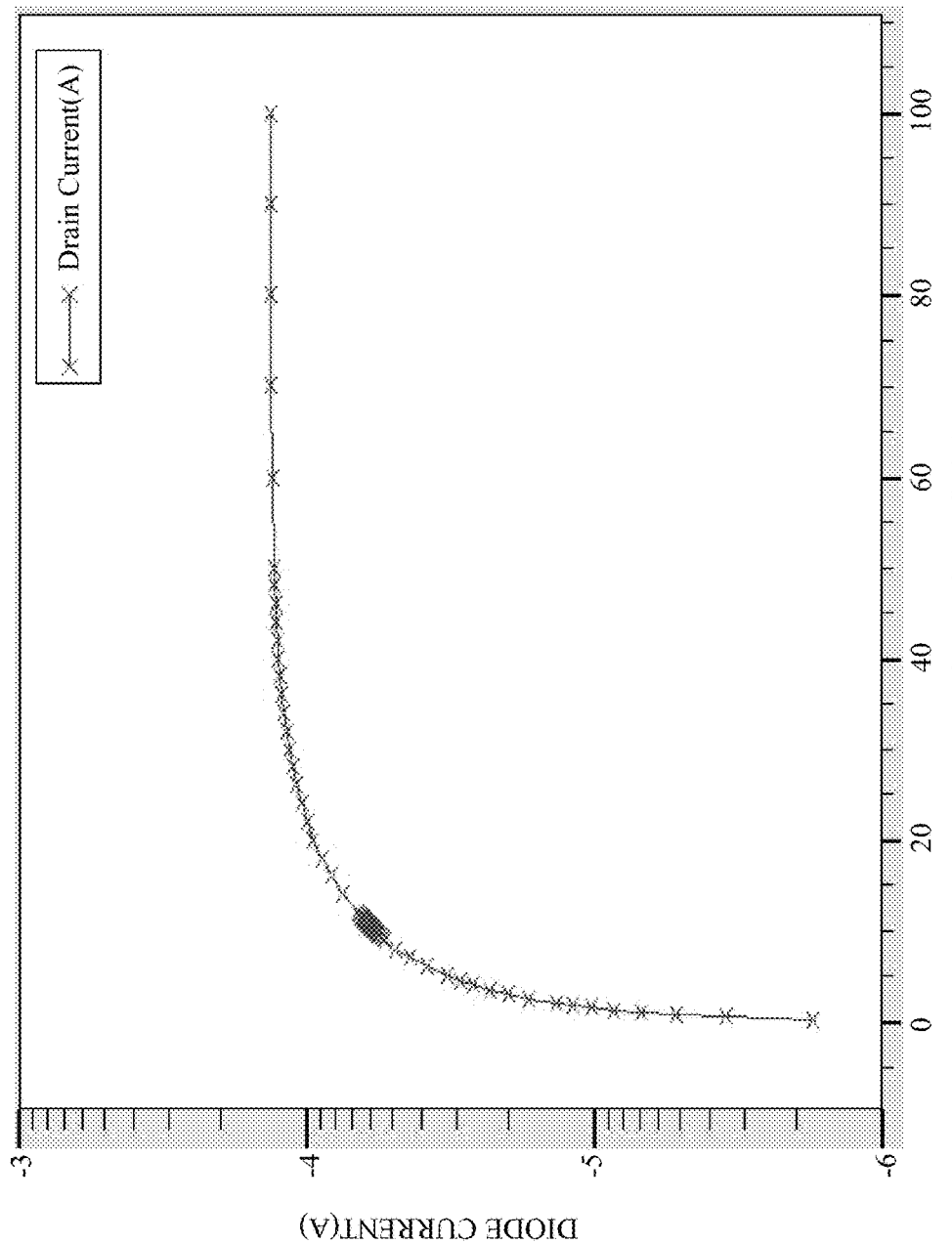
FIG. 14 is a chart of a forward drain current versus drain voltage curve of the active portion of the second embodiment.

Further referring to FIGS. 12 to 14, FIG. 12 illustrates simulation results of breakdown field strength of the one of the transistors 318 of the active portion 31 of the second embodiment of the power semiconductor device. The result shows that by way of the second semiconductor pillar regions 312 of the active portion 31 being trapezoidal in cross-sectional shape and the second-type semiconductor segments 314 being spaced apart from one another, the breakdown field strength can be decreased. FIG. 13 is a chart showing reverse drain current versus drain voltage curve of the active portion 31 of the second embodiment of the power semiconductor device. The result shows that the breakdown voltage of the active portion 31 is around 590 V. FIG. 14 is a chart showing a forward drain current versus applied drain voltage curve of the active portion 31 of the second embodiment of the power semiconductor device. By multiplying a tangent slope of the forward drain current versus drain voltage at 10V of the applied drain voltage by a cross-sectional area of the active portion 31, the on-state resistance (Rds(on)) is around 26.3 mΩ–cm$^2$. The on-state resistance of the second embodiment is lower than that of the first embodiment, which may result from a broadened conduction path at trapezoidal-shaped drift regions that are respectively formed in the first-type semiconductor sections 313 of the active portion 31.

Figure 15:
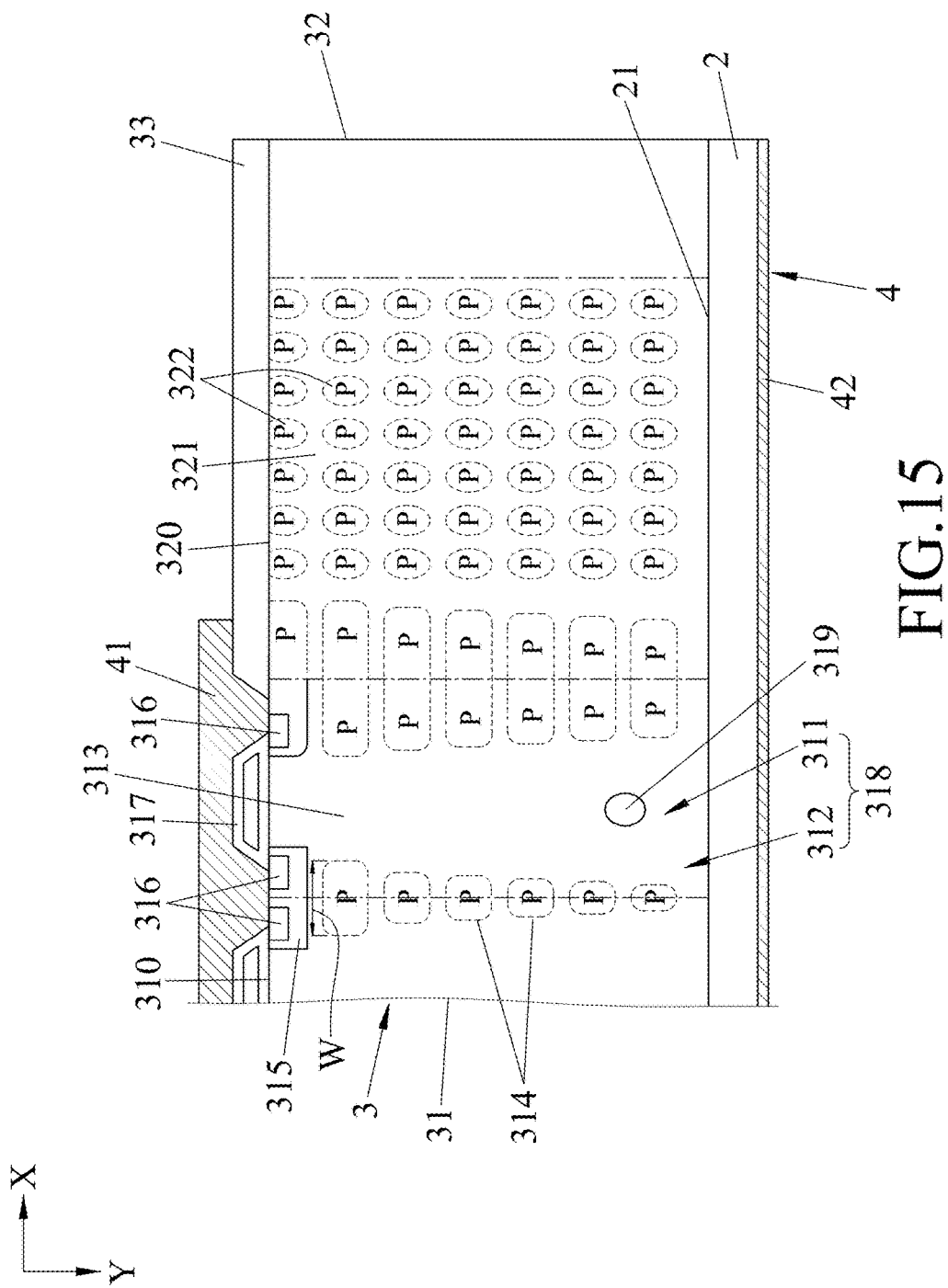
FIG. 15 is a fragmentary schematic cross-sectional view of a third embodiment of the power semiconductor device according to the disclosure.
Figure 16:
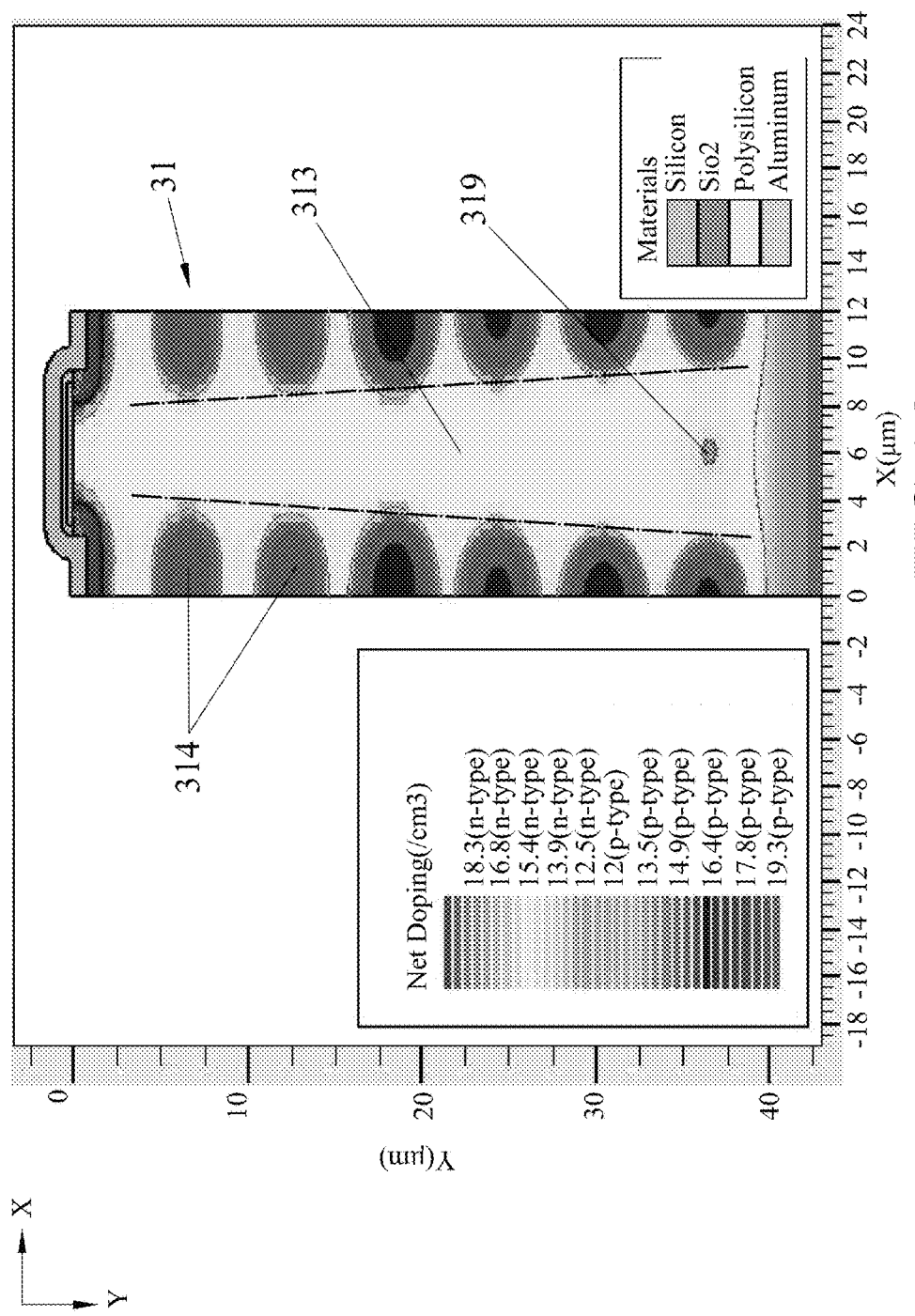
FIG. 16 is a plot illustrating simulation results of one of transistors of an active portion of the third embodiment.

Referring to FIGS. 15 and 16, a third embodiment of the power semiconductor device according to the disclosure, and simulation results of one of the transistors of the active portion 31 of the third embodiment using the same software as that of the first embodiment are respectively illustrated. Each of the second-type semiconductor segments 314 of each of the second semiconductor pillar regions 312 of the active portion 31 has a width (W) extending along the X-direction. The widths (W) of the second-type semiconductor segments 314 of each of the second semiconductor pillar regions 312 decrease along the Y-direction, such that each of the second semiconductor pillar regions 312 has an inverted trapezoidal cross-section. Furthermore, each of the first semiconductor pillar regions 311 further includes a second-type semiconductor section 319 that is surrounded by the first-type semiconductor section 313. The second-type semiconductor section 319 of each of the first semiconductor pillar regions 311 is disposed between and is spaced apart from two adjacent ones of the second semiconductor pillar regions 312 and is close to the substrate 2. With the inclusion of the second-type semiconductor sections 319, the accumulated electrostatic charges and the undesired leakage current in the first-type semiconductor sections 313 that are close to the substrate 2 can be compensated.

Figure 17:
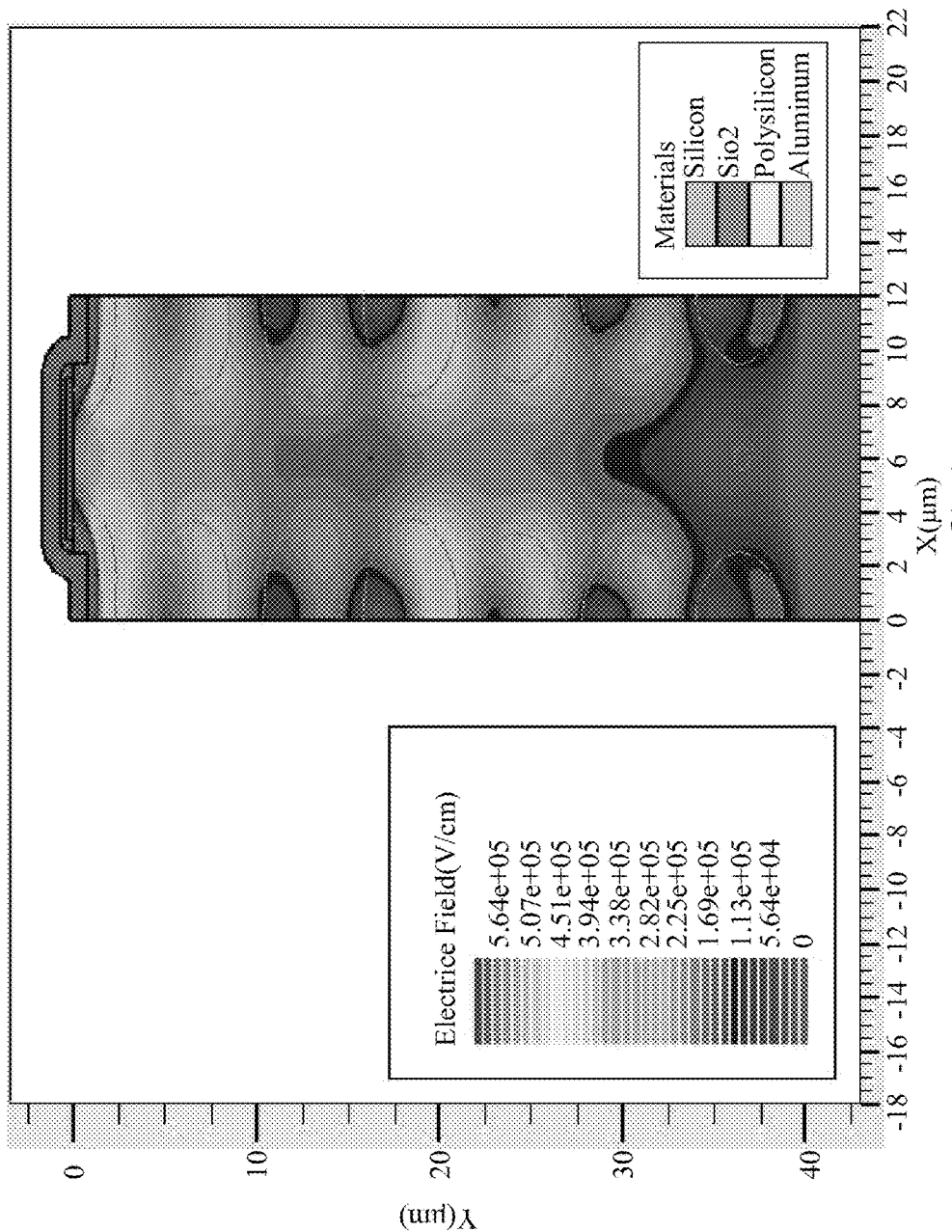
FIG. 17 is a plot illustrating simulation results of breakdown field strength of the one of transistors of the active portion of the third embodiment.
Figure 18:
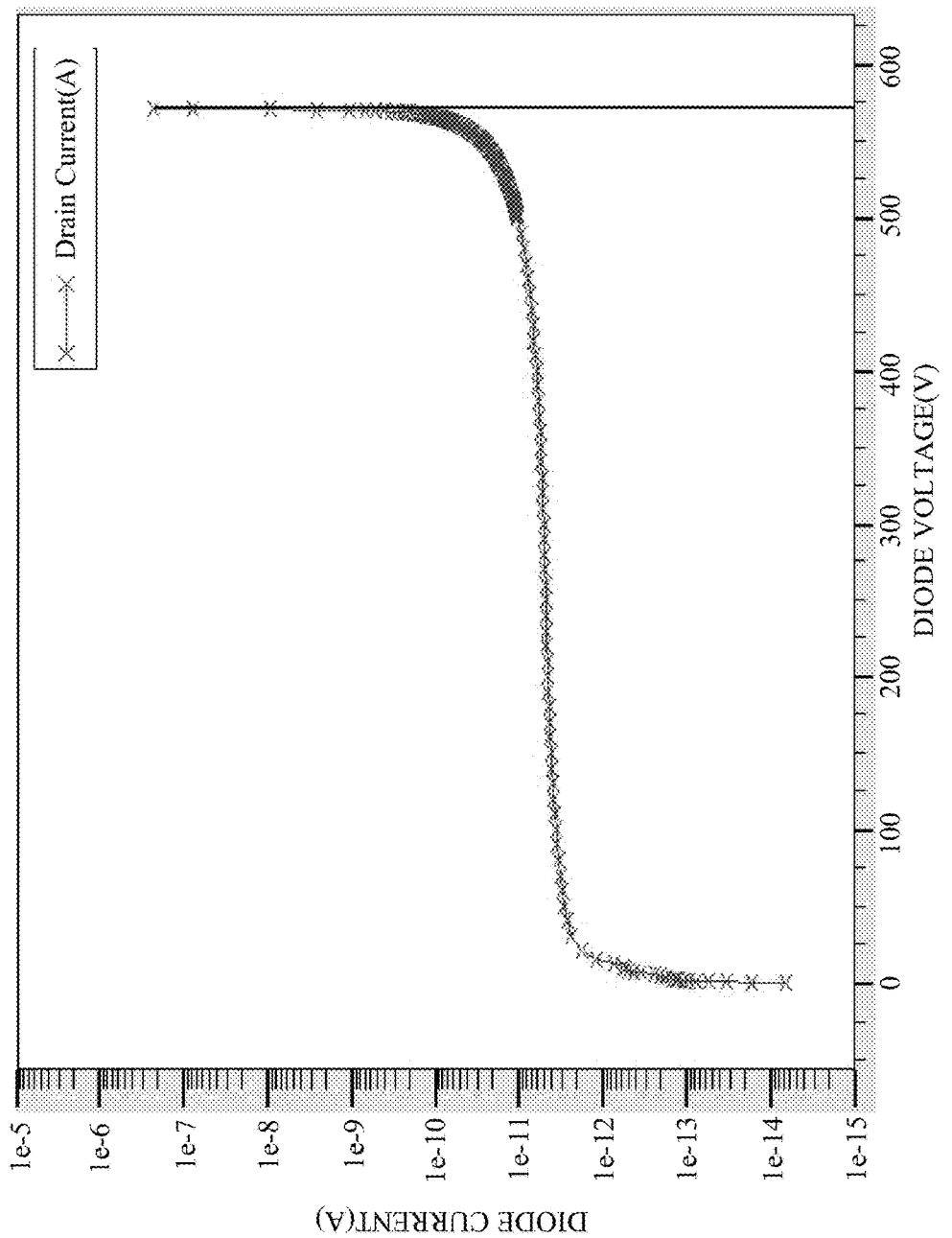
FIG. 18 is a chart of a reverse drain current versus drain voltage curve of the active portion of the third embodiment.

Further referring to FIGS. 17 and 18, simulation results of breakdown field strength of one of the transistors 318 of the active portion 31 of the third embodiment of the power semiconductor device, and a chart of a reverse drain current versus drain voltage curve of the active portion 31 of the third embodiment of the power semiconductor device are respectively illustrated. The curve of FIG. 18 shows that the breakdown voltage of the active portion 31 is around 575 V.

It is noted that the second-type doping concentrations of the second-type semiconductor segments 314 of the second semiconductor pillar regions 312 may be the same along the X-direction without a limitation of varying the doping concentrations along the X-direction.

To sum up, by virtue of the design and arrangement of the second-type semiconductor segments 314, 322 and the varying second-type doping concentrations of the second-type semiconductor segments 314, 322, the electric field intensity of the power semiconductor device of this disclosure can be distributed evenly. In addition, since the width (W) of each of the second semiconductor pillar regions 312 may be decreased along the Y-direction, the on-state resistance of the power semiconductor device can be decreased as well.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A power semiconductor device, comprising:
   a substrate having a top side;
   a main body including an active portion disposed on said substrate, an edge termination portion disposed on said topside of said substrate and surrounding said active portion, and an insulating layer disposed on said edge termination portion and spaced apart from said substrate, said edge termination portion including an edge termination top surface underlying said insulating layer, a first-type semiconductor region that extends from said top side of said substrate to said edge termination top surface, and a plurality of spaced-apart second-type semiconductor segments distributed in said first-type semiconductor region, said spaced-apart second-type semiconductor segments being arranged at intervals along a Y-direction directing from said insulating layer toward said substrate, said spaced-apart second-type semiconductor segments being arranged to have at least one interval along an X-direction that is perpendicular to the Y-direction and that directs from said active portion toward said edge termination portion; and
   an electrode unit including a first electrode that is disposed on said insulating layer and that is electrically coupled to said active region, and a second electrode that is disposed on said substrate and that is spaced apart from said main body.

2. The power semiconductor device of claim 1, wherein said second-type semiconductor segments of said edge termination portion are arranged at multiple intervals along the X-direction.

3. The power semiconductor device of claim 1, wherein said second-type semiconductor segments of said edge termination portion have varying second-type doping concentrations that vary along the X-direction, a second-type doping concentration difference between two adjacent ones of said second-type semiconductor segments being less than 10%.

4. The power semiconductor device of claim 3, wherein the second-type doping concentrations are increased along the X-direction.

5. The power semiconductor device of claim 3, wherein the second-type doping concentrations are decreased along the X-direction.

6. The power semiconductor device of claim 1, wherein said second-type semiconductor segments of said edge termination portion have varying second-type doping concentrations that vary along the Y-direction, a second-type doping concentration difference between two adjacent ones of said second-type semiconductor segments being less than 10%.

7. The power semiconductor device of claim 6, wherein the second-type doping concentrations of said second-type semiconductor segments are increased along the Y-direction.

8. The power semiconductor device of claim 6, wherein the second-type doping concentrations of said second-type semiconductor segments are decreased along the Y-direction.

9. The power semiconductor device of claim 1, wherein said active portion of said main body includes a plurality of first and second semiconductor pillar regions that alternate along the X-direction, each of said second semiconductor pillar regions having a plurality of spaced-apart second-type semiconductor segments aligned along the Y-direction.

10. The power semiconductor device of claim 9, wherein each of said second-type semiconductor segments of one of said second semiconductor pillar regions, which is most adjacent to said edge termination portion, is connected to a respective one of said second-type semiconductor segments of said edge termination portion, which is most adjacent to said one of said second semiconductor pillar regions.

11. The power semiconductor device of claim 9, wherein said second-type semiconductor segments of one of said second semiconductor pillar regions, which is most adjacent to said edge termination portion, are respectively disconnected to said second-type semiconductor segments of said edge termination portion, which are most adjacent to said one of said second semiconductor pillar regions.

12. The power semiconductor device of claim 9, wherein each of said second-type semiconductor segments of each of said second semiconductor pillar regions of said active portion has a width extending along the X-direction, the widths of said second-type semiconductor segments of each of said second semiconductor pillar regions being decreased along the Y-direction.

13. The power semiconductor device of claim 12, wherein each of said first semiconductor pillar regions includes a first-type semiconductor section, and a second-type semiconductor section that is surrounded by said first-type semiconductor section, said second-type semiconductor section being disposed between and spaced apart from two adjacent ones of said second semiconductor pillar regions and close to said substrate.

14. The power semiconductor device of claim 9, wherein said second-type semiconductor segments of said second semiconductor pillar regions have varying second-type doping concentrations that vary along the Y-direction, each two adjacent ones of said second-type semiconductor segments in each of said second semiconductor pillar regions having a second-type doping concentration difference therebetween, which is less than 10%.

15. The power semiconductor device of claim 14, wherein the second-type doping concentrations of each of said second semiconductor pillar regions are increased along the Y-direction.

16. The power semiconductor device of claim 14, wherein the second-type doping concentrations gradient of each of said second semiconductor pillar regions is decreased along the second direction.

* * * * *